(12) United States Patent
Dietz et al.

(10) Patent No.: US 7,923,362 B2
(45) Date of Patent: Apr. 12, 2011

(54) METHOD FOR MANUFACTURING A METAL-SEMICONDUCTOR CONTACT IN SEMICONDUCTOR COMPONENTS

(75) Inventors: Franz Dietz, Untereisesheim (DE);
Volker Dudek, Brackenheim (DE);
Tobias Florian, Stuttgart (DE); Michael Graf, Leutenbach (DE)

(73) Assignee: TELEFUNKEN Semiconductors GmbH & Co. KG, Heilbronn (DE)

( * ) Notice: Subject to any disclaimer, the term of this patent is extended or adjusted under 35 U.S.C. 154(b) by 0 days.

(21) Appl. No.: 11/447,094

(22) Filed: Jun. 6, 2006

(65) Prior Publication Data

US 2006/0281291 A1 Dec. 14, 2006

Related U.S. Application Data

(60) Provisional application No. 60/692,571, filed on Jun. 22, 2005.

(30) Foreign Application Priority Data

Jun. 8, 2005 (DE) .......................... 10 2005 026 301

(51) Int. Cl.
*H01L 21/28* (2006.01)
(52) U.S. Cl. ........ 438/571; 438/534; 438/570; 438/572; 438/573; 438/574; 438/575; 438/576; 438/577; 438/578; 438/579; 438/580; 438/581; 438/582; 438/583
(58) Field of Classification Search .................. 438/534, 438/570–583
See application file for complete search history.

(56) References Cited

U.S. PATENT DOCUMENTS

| | | | |
|---|---|---|---|
| 4,173,063 A | 11/1979 | Kniepkamp et al. | |
| 4,206,540 A | 6/1980 | Gould | |
| 4,859,616 A | 8/1989 | Losehand et al. | |
| 4,894,701 A | 1/1990 | Erhardt et al. | |
| 5,059,555 A | 10/1991 | Iranmanesh et al. | |
| 5,216,264 A | 6/1993 | Fujii et al. | |
| 5,217,911 A | 6/1993 | Denda | |
| 5,672,898 A * | 9/1997 | Keller et al. | 257/383 |
| 5,696,025 A | 12/1997 | Violette et al. | |
| 5,710,447 A | 1/1998 | Tohyama | |
| 6,043,115 A * | 3/2000 | Pan | 438/199 |
| 6,200,904 B1 | 3/2001 | Tan et al. | |
| 6,410,420 B2 * | 6/2002 | Akram et al. | 438/630 |
| 6,455,403 B1 * | 9/2002 | Hwang et al. | 438/576 |
| 6,465,786 B1 | 10/2002 | Rhodes | |
| 6,791,154 B2 | 9/2004 | Matsumoto et al. | |
| 2001/0023958 A1 * | 9/2001 | Todorobaru et al. | 257/307 |
| 2001/0034116 A1 | 10/2001 | Lee et al. | |
| 2002/0038911 A1 * | 4/2002 | Graas et al. | 257/763 |

(Continued)

FOREIGN PATENT DOCUMENTS

DE 26 31 873 1/1978

(Continued)

*Primary Examiner* — Matthew S Smith
*Assistant Examiner* — Jae Lee
(74) *Attorney, Agent, or Firm* — Muncy, Geissler, Olds & Lowe, PLLC (57) ABSTRACT

A method for manufacturing a metal-semiconductor contact in semiconductor Components is disclosed. There is a relatively high risk of contamination in the course of metal depositions in prior-art methods. In the disclosed method, the actual metal-semiconductor or Schottky contact is produced only after the application of a protective layer system, as a result of which it is possible to use any metals, particularly platinum, without the risk of contamination.

14 Claims, 5 Drawing Sheets

U.S. PATENT DOCUMENTS

| | | |
|---|---|---|
| 2002/0076895 A1 | 6/2002 | Chien et al. |
| 2003/0139001 A1 | 7/2003 | Snyder et al. |
| 2003/0168676 A1 | 9/2003 | Itabashi et al. |
| 2003/0203546 A1* | 10/2003 | Burbach et al. ............... 438/151 |
| 2004/0087078 A1* | 5/2004 | Agarwala et al. ............. 438/200 |
| 2004/0099893 A1* | 5/2004 | Martin et al. ................ 257/295 |
| 2005/0225683 A1* | 10/2005 | Nozawa ........................ 348/801 |
| 2006/0131619 A1* | 6/2006 | Wu ............................... 257/260 |

FOREIGN PATENT DOCUMENTS

| | | |
|---|---|---|
| DE | 29 21 971 | 12/1979 |
| EP | 0 182 088 A1 | 5/1986 |
| JP | 3-256369 | 11/1991 |

* cited by examiner

METHOD FOR MANUFACTURING A METAL-SEMICONDUCTOR CONTACT IN SEMICONDUCTOR COMPONENTS

This nonprovisional application claims priority to Provisional Application No. 60/692,571, which was filed on Jun. 22, 2005, and to German Patent Application No. DE 102005026301, which was filed in Germany on Jun. 8, 2005, and which are all herein incorporated by reference.

BACKGROUND OF THE INVENTION

1. Field of the Invention

The present invention relates to a method for manufacturing a metal-semiconductor contact in a semiconductor component made of a semiconductor material and produced in a process, such as a transistor produced in a standard CMOS process, which to terminate the process is provided with a layer system having an arrangement of electrically insulating and electrically conductive layers (also called a BEOL layer below; BEOL: back end of line). Moreover, the invention relates to a semiconductor component, such as a transistor produced in a standard CMOS process, with at least one metal-semiconductor contact, manufactured according to a method of the invention, and in general an especially light-sensitive metal-semiconductor contact (photodiode).

2. Description of the Background Art

Semiconductor components with a metal-semiconductor contact, a so-called Schottky contact, which because of the disappearing charge storage in the on state represents an extremely fast switching (Schottky) diode, which brings about circuitry advantages known to the person skilled in the art, or methods for the manufacture thereof are known, for example, from the Unexamined German Patent Applications, DE 26 31 873 C2 (which corresponds to U.S. Pat. No. 4,173,063) and DE 29 21 971 C2 (which corresponds to U.S. Pat. No. 4,206,540), the European Patent EP 0 182 088 A1 (which corresponds to U.S. Pat. No. 4,859,616), U.S. Pat. No. 5,216,264, U.S. Pat. No. 6,656,823 B2, U.S. Pat. No. 6,784,035 B2, and from a publication by Soole and Schumacher from the year 1990 (IEEE Trans. Electron. Devices 37, 2285). Certain metal-semiconductor contacts, such as tungsten (Wo)-silicon, titanium (Ti)-silicon, or platinum (Pt)-silicon, possess in addition light-sensitive properties and thereby can also be used as photodiodes. In this regard, provided this is explicitly disclosed in the aforementioned publications, depending on the employed semiconductor material and its doping, the deposition of a metal is routinely necessary to produce the Schottky contacts. According to the prior art, this is associated with a considerable risk of contamination, because certain metals (Me), particularly Pt, diffuse extensively into the semiconductor material, e.g., silicon (Si), which has a negative effect on the lifetime of the charge carrier in the semiconductor. This can result in failure of the affected components and lead to production rejects with the associated negative consequential costs. For this reason, manufacturing plants for semiconductor components must be kept strictly free of $Me^{+\ ions}$.

In practice, to circumvent the aforementioned difficulty in the manufacture of Schottky diodes or photodiodes and in general semiconductor components with metal-semiconductor contact(s), Ti, which binds well especially with silicon semiconductor material and exhibits hardly any diffusion effects, is used preferably as the metal. However, Pt-Si contacts in particular offer certain electrical advantages. Thus, Pt on n-Si has a high voltage barrier, so that only a very low dark current flows, which represents a great advantage for certain applications. Moreover, the Me silicides, which must be generated in the contact production for an intimate bond, in the case of Ti form only at temperatures $T>600°$ C., which during annealing can lead to damage to the already produced semiconductor structures. In contrast, Pt or Wo suicides already form at $T<300\text{-}400°$ C., which is why the possible use of these metals would bring about additional production advantages, but is not an option in practice in the course of manufacturing methods employed thus far.

SUMMARY OF THE INVENTION

It is therefore an object of the present invention to provide a method to minimize the risk of contamination due to unwanted (foreign) metal depositions, so that the aforementioned negative consequences can be avoided as much as possible and, moreover, any metals, also those with an unfavorable diffusion behavior in the semiconductor material, can be used to form the contacts. Furthermore, the object of the invention is to provide a method, with which any foreign metals can be bonded with standard semiconductor components substantially without any risk of contamination. This object also extends to the making of suitable semiconductor components, particularly light-sensitive metal-semiconductor contacts (photodiodes).

This object is achieved as taught by the invention by a method for manufacturing a metal-semiconductor contact in a semiconductor component, made of a semiconductor material and produced in a process, such as a transistor produced in a standard CMOS process, which to terminate the process is provided with a layer system (BEOL layer) of an arrangement of electrically insulating and electrically conductive layers, wherein, first, the layer system is applied to the standard component, next, at least one window is opened in an electrically insulated area of the layer system, and then a metal is applied at least in the area of the window, so that at least the semiconductor material is contacted by the metal in places in the area of the window.

The actual metal-semiconductor or Schottky contact can therefore be produced only at the end of the process, after the application of the aforementioned connection/passivation layer system (BEOL layer), as a result of which the previously described problems are avoided. Thus any metals, particularly platinum in combination with silicon semiconductor material, can be used without the risk of contamination. For this purpose, the layer system is again removed in at least one electrically insulating window area in order to contact the underlying semiconductor material directly with the metal to be applied, whereby this type of approach according to the prior art would encounter considerable prejudice because of the relatively extensive window depth (typically several micrometers). According to the invention, however, the manufacture of the metal-semiconductor contact without the risk of contamination can be integrated cost-effectively directly, optionally in a modular manner, or into the processes for producing the standard component.

The aforementioned object is also achieved by a method for manufacturing semiconductor components, the method which comprises the procedure module of the invention. In this regard, the procedure module can run as a process module in a special production line connected to the standard process or externally, i.e., at a manufacturing plant external to the standard process.

The aforementioned object is achieved, furthermore, by a semiconductor component, such as a transistor produced in a standard CMOS process, with at least one metal-semiconductor contact manufactured according to the method of the invention. Preferably, the substrate of this semiconductor components—the semiconductor material—is a suitable p-doped or n-doped silicon substrate. However, other substrates, such as an SOI substrate (SOI: silicon on insulator), may also be used.

In a further embodiment of the method of the invention, it is provided that, before the application of the layer system, a contact area, substantially located in the area of the window, of the semiconductor component is covered with an action stop layer, such as an etch stop layer, so that when the window is opened the semiconductor component areas below the exposure stop layer are not acted upon.

Next, according to the invention, the window in the layer system is opened, for example, in an etching process, in an electrically insulating area above the etch stop layer, which is to be used subsequently as a diode window for the manufacture of the Schottky contact. Preferably, the etch stop layer is again removed after this at least in the area of the window.

To make the actual metal-semiconductor contact(s), a further embodiment of the method of the invention provides for contact openings, which extend at least to the semiconductor material, that are made for the metal in layers of the semiconductor component in the area of the (diode) window. After this structuring of the window opening, the metal is thereupon applied to the exposed surfaces and in this way contacts directly at least the semiconductor material, i.e., the surface thereof or that of the semiconductor component.

Then, after the application of the metal has taken place, for the purpose of creating an intimate bond between the metal and the contact material, e.g., n-silicon, a heat treatment occurs in the form of an anneal, so that areas of chemical compounds of the metal with the semiconductor material are formed at the contact sites of metal and semiconductor material. According to the presently described embodiment of the invention, chemical compounds form in this way in the form of silicides, preferably Pt—Si or Wo—Si. Next, the chemically unchanged metal is removed so that the silicided contact sites are exposed.

After the metal has been removed, an electrically conductive barrier material, e.g., titanium, can be applied to the contact areas to prevent further diffusion, so that the contact openings are substantially completely filled. Next, at least in areas above the contact openings and in contact with at least the barrier material, a contact material, such as a contact metal, can be applied for electrical contacting of the made Schottky diodes. The thus made contacts are then routed to a circuit, which is not specified in greater detail here, that is connected to the Schottky diode.

Thereafter, a passivation layer, e.g., an oxide layer, can be applied to all exposed surfaces of the semiconductor component to protect the underlying layers.

Thus, the best properties of the foreign metal layers, particularly of the Schottky contact described in detail above, result from the present invention, because the production thereof is not followed by further temperature processing and additional BEOL structuring, which because of their aggressive action could have a detrimental effect on the properties of the layers of the semiconductor component.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In the following text, the manufacture of a Schottky contact according to the invention will be described within the scope of an exemplary embodiment with the use of sectional views of a relevant semiconductor component. The semiconductor component may be a standard CMOS transistor. However, the invention is not limited thereto, but comprises, furthermore, in addition to bipolar transistors, also all other semiconductor components in which metal-semiconductor contacts are used.

Figure 1:
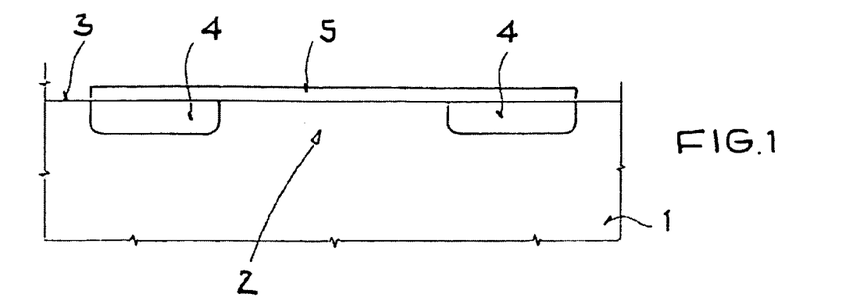
FIG. 1 to 14 illustrates process steps of the invention, following one another in time, for manufacturing a Schottky contact, according to an embodiment of the present invention.

According to FIG. 1, first in a semiconductor component 1 manufactured in a standard manner, here a CMOS transistor made of suitably doped silicon, e.g., n-silicon, in a standard manufacturing process, an area 2 (contact area) is geometrically defined in a conventional manner on semiconductor component 1 and on its surface 3 by an electrically insulating field oxide layer 4 and covered by an additional electrically insulating layer 5. The additional layer 5 can be a gate oxide layer, for example, of thermally grown silicon oxide ($SiO_2$), which can be replaced by an insulator with a high dielectric constant. Field oxide layer 4 can be made advantageously thereby ring-shaped and thus limits area 2 on all sides. The application (and lifting off or structuring) of this and the additional layers to be arranged according to the invention proceeds by techniques, such as CVD, wet oxidation, photolithographic mask structuring, etching, or the like.

Figure 2:
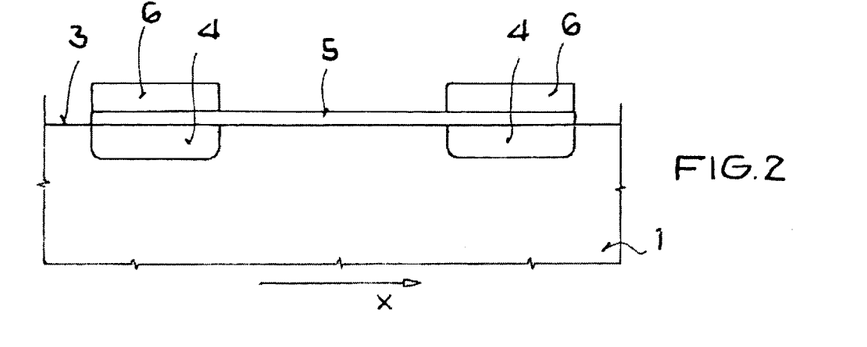

Then, according to FIG. 2, a connection between the product of the standard process (see above) and the Schottky diode to be made is applied in places to gate oxide 5 in the form of an interconnect layer 6 made of polysilicon. "In places" here means that the polysilicon is not applied to cover completely the aforementioned oxide layer. Interconnect layer 6 according to the shown exemplary embodiment is aligned in a covering manner with field oxide layer 4, whereby the lateral dimensions of the mentioned layers 4, 6 are identical in the direction of the arrow X.

Figure 3:
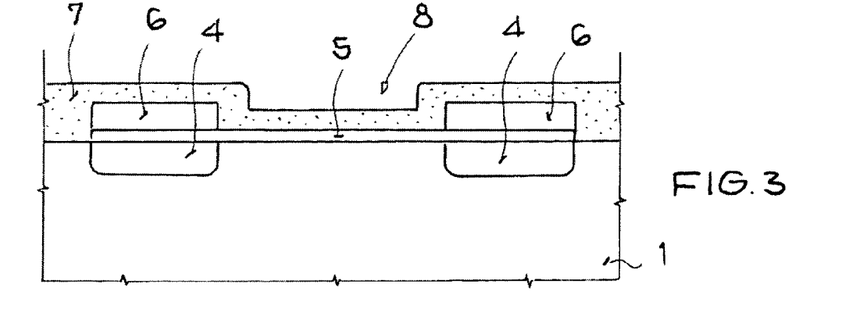

According to the next process step shown in FIG. 3, the diode, i.e., the previously described arrangement of field oxide layer 4, gate oxide layer 5, and polysilicon interconnect layer 6, is thereupon covered with an insulating material 7, such as an oxide or a suitable dielectric insulating material, e.g., BPSG. According to the shown embodiment, a recess 8 in insulating material 7 thus forms above area 2 (cf. FIG. 1).

Figure 4:
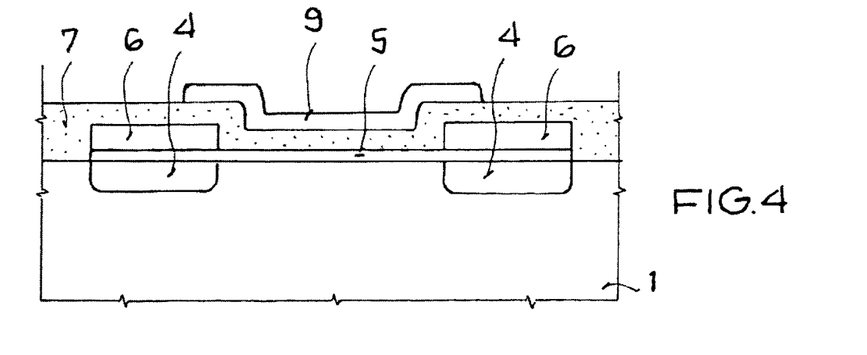
Figure 5:
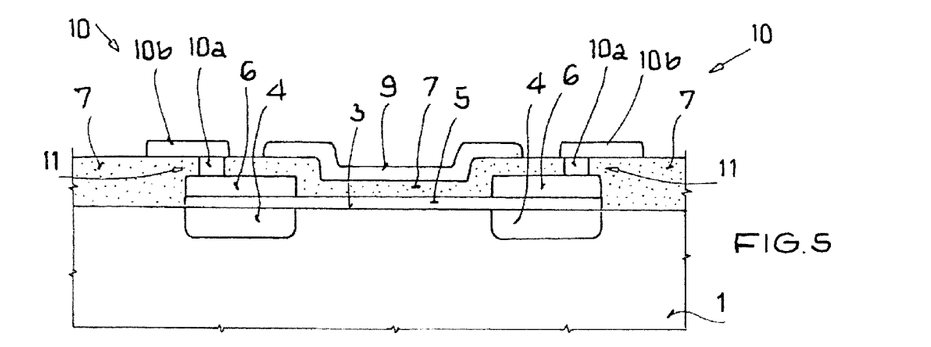

Next, according to the diagram in FIG. 4, an etch stop layer 9 of polysilicon is applied in the area of recess 8 and in addition (cf. FIG. 3) to insulating material 7. Furthermore, the following FIG. 5 shows the application of a connection 10 to the CMOS site, i.e., to the side facing away from area 2 (FIG. 1) of the arrangement created thus far. For this purpose, an opening 11 is first made in insulating material 7 and filled with an electrically conductive material 10a, such as aluminum (Al), Si, or copper (Cu), so that connection layer 10b applied to the insulating material 7 to the side of the etch stop layer 9 contacts conductively interconnect layer 6.

Figure 6:
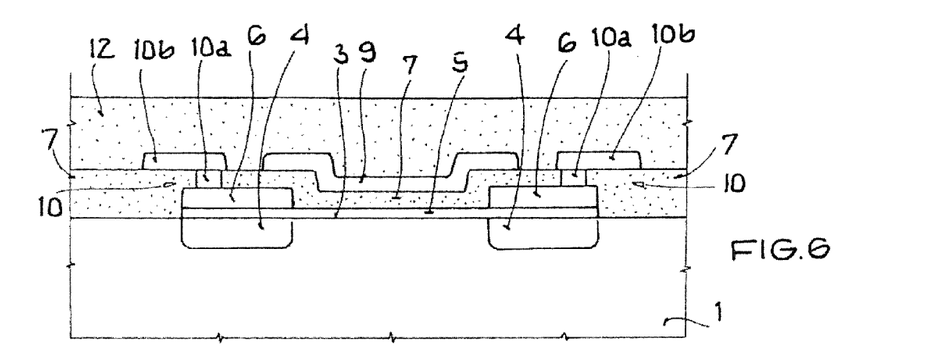

According to FIG. 6, a layer system 12 of an arrangement of electrically conductive connection layers and electrically insulating passivation or insulation layers made of oxide(s) and metals (for purposes of connection) is then applied to structures 7, 9, 10b, exposed according to FIG. 5, of semiconductor component 1. Layer system 12, whose precise internal structure is not shown here, is also described within the scope of the present invention as a BEOL layer.

Figure 7:
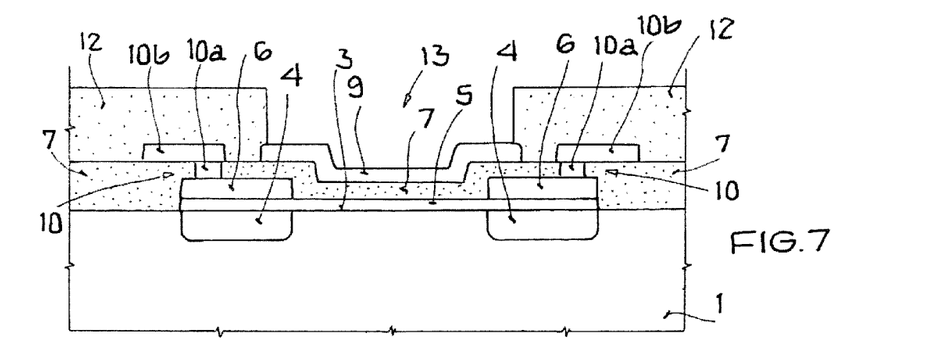
Figure 8:
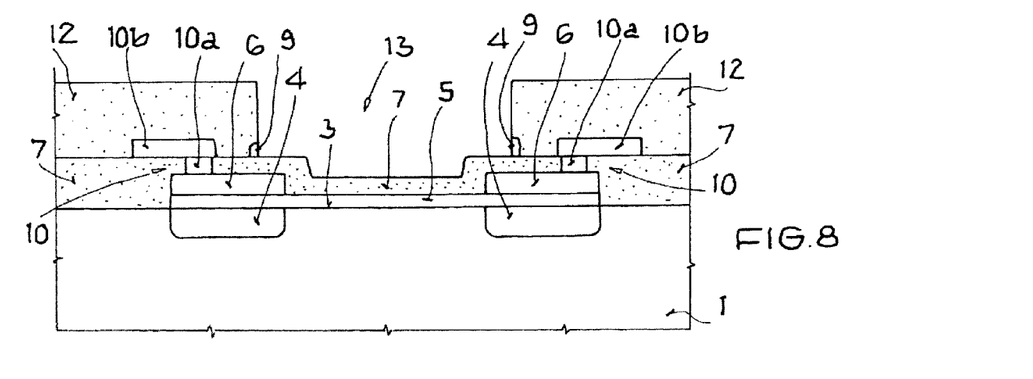

A window 13 is then opened in this BEOL layer 12—FIG. 7—above electrically insulating area 2 (FIG. 1) by lifting off the material, so that etch stop layer 9 is exposed in this area. Etch stop layer 9 is then partially removed in a subsequent process step according to FIG. 8, so that the insulating material 7 is now exposed in the area of the window 13.

Figure 9:
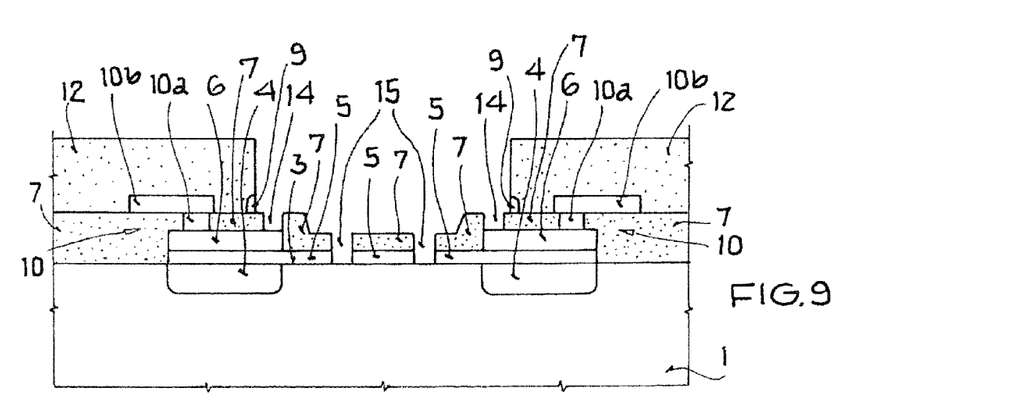

The window opening is then structured by a conventional method by making, on the one hand, groove-shaped openings 14 in the insulating material 7 above interconnect layer 6 and, on the other hand, openings 15 in insulating material 7 and in gate oxide layer 6 above the area 2 (FIG. 1), whereby openings 14, 15, which function as contact openings according to the invention, each extend to interconnect layer 6 or to surface 3 of the semiconductor material of semiconductor component 1 and can extend further into the plane of the drawing. This is shown in section in FIG. 9.

Figure 10:
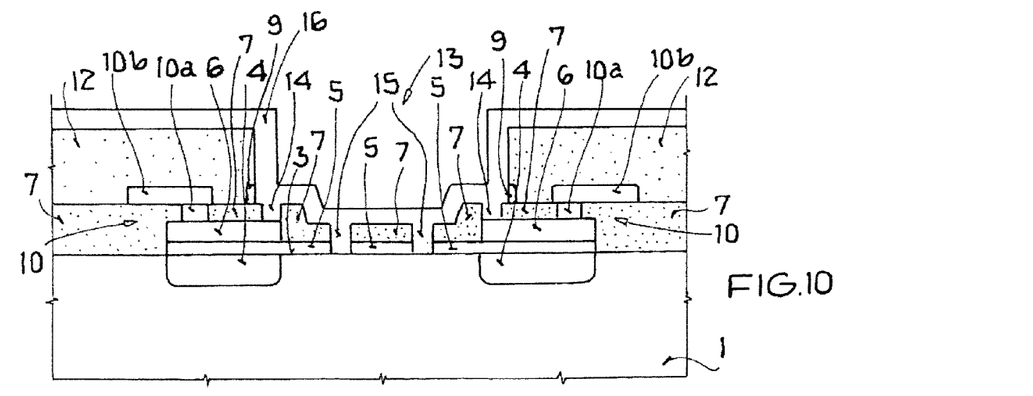
Figure 11:
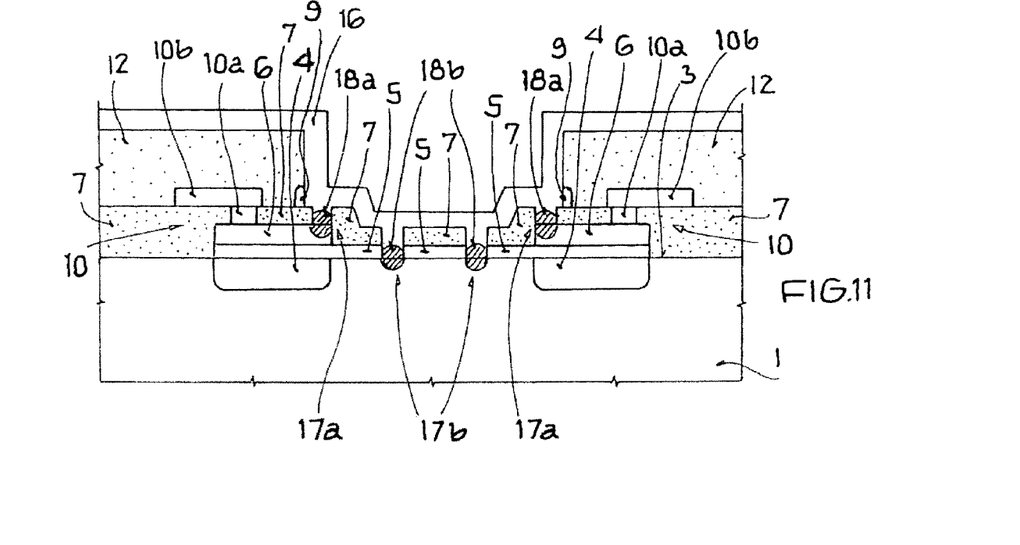

According to FIG. 10, a suitable metal 16, such as platinum for the purpose of making a light-sensitive contact with a low dark current, is then deposited on layer system 12 and on all exposed surfaces within the area of window 13, particularly on interconnect layer 6 or semiconductor surface 3 in the area of openings 14, 15. Then, the thus made structure is subjected to a heat treatment (anneal), as a result of which a suitable silicide 18a, 18b, such as Pt—Si, forms at contact sites 17a, 17b of metal 16 and polysilicon 6 or of metal 16 and the semiconductor material of component 1. This is shown in FIG. 11. The anneal occurs preferably at about 300 to 500° C. and is thereby, in regard to temperature and possibly present detrimental action, clearly below the temperature for the conventionally employed titanium (T≈600° C.).

Figure 12:
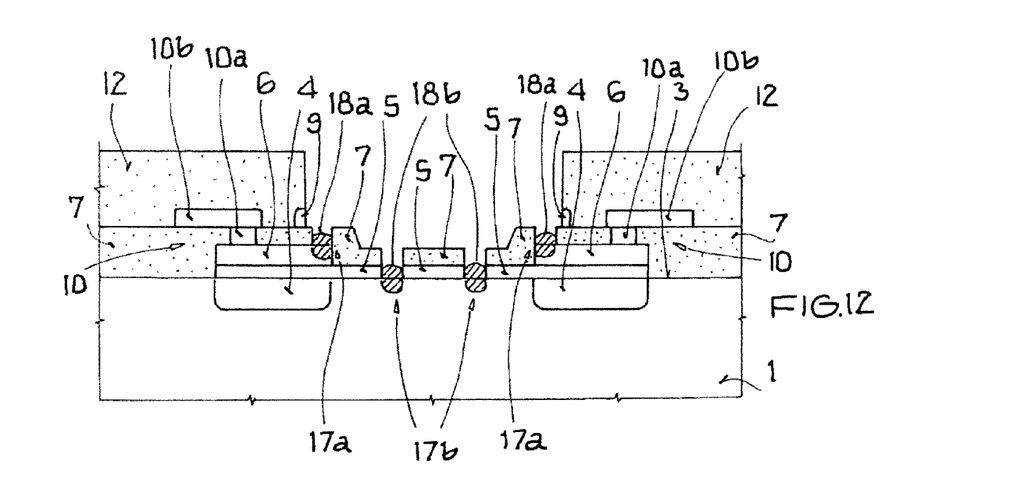
Figure 13:
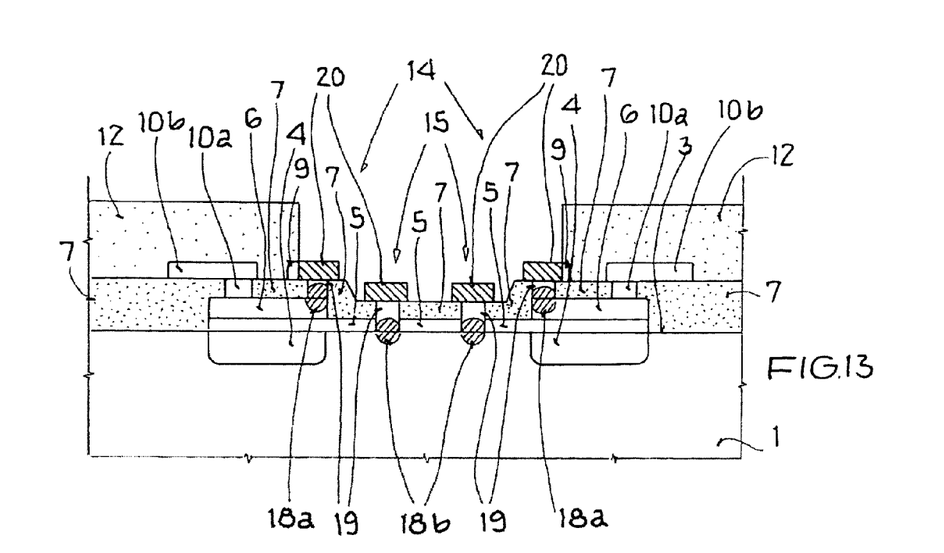

Next, according to FIG. 12, metal 16 that has not been silicided is removed so that the silicide areas 18a, 18b are exposed. As shown in FIG. 13, a suitable barrier material 19, for example, titanium, is then applied to these so that contact openings 14, 15 are substantially completely filled with barrier material 19. Because of its special properties, the barrier material has the result that no uncontrolled diffusion of metal ions occurs. A contact metal 20, such as Al or Cu, is then deposited on barrier material 19. It is also possible, however, to deposit Si instead of a metal.

Figure 14:
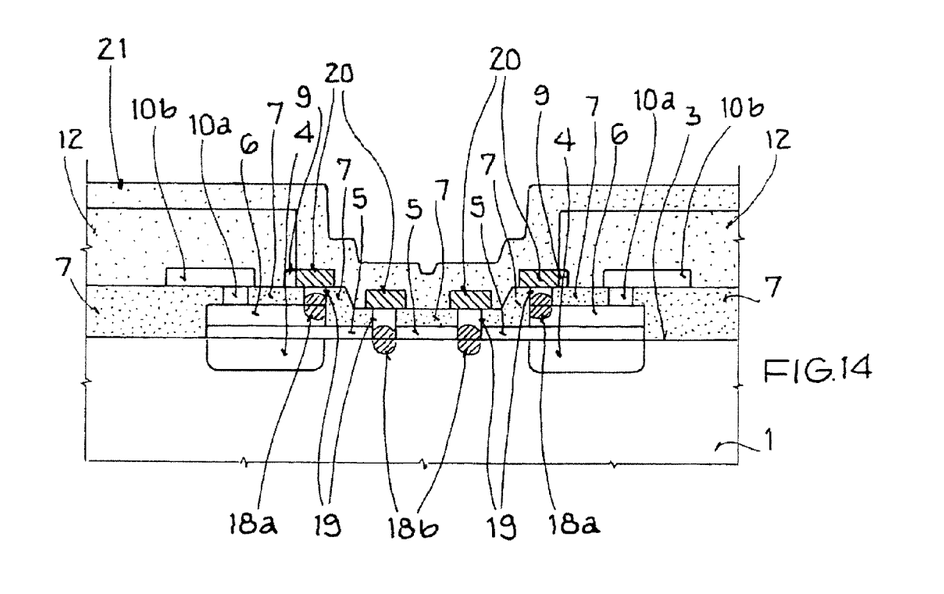

FIG. 14 shows the application of a passivation 21 of oxide or another suitable dielectric insulating material for passivating and protecting the thus made semiconductor component with a metal-semiconductor contact (Schottky contact). Layer 21 can be formed advantageously as an ARC layer (ARC: anti-reflective coating), e.g., as a λ/4-layer, if the refractive index n and the layer thickness are known, so that a transmission peak for the incident light radiation on the light-sensitive element is achievable. According to the invention, the light can be radiated directly from above onto the diode structure. Alternatively or in addition, lateral photoconductors can also be provided in the semiconductor material to the site of the metal-semiconductor contact (not shown here), which utilize, for example, the transparency of Si in certain spectral ranges.

Furthermore, barrier wells (also not shown) can be provided in the semiconductor material also below the silicide areas in order to suppress diffusion of metal into the semiconductor component.

By means of the method described above, light-sensitive Schottky contacts (photodiodes) or semiconductor components, such as transistors produced in a standard CMOS process, can be realized selectively with at least one metal-semiconductor contact with the use of any metals, such as platinum or metals with similar properties, without a risk of contamination due to metal depositions for the manufactured device or for the component to be manufactured. This is achieved by the process separation set forth in detail (first manufacture of the semiconductor component, then production of the metal-semiconductor contact as described).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a metal-semiconductor contact, the method comprising:
    providing a semiconductor component having an upper surface;
    applying a layer system comprising at least one insulation layer and at least one electrically conductive layer onto the upper surface of the semiconductor component such that a first contact area and a second contact area of a schottky diode are formed, the first contact area being electrically insulated from the second contact area, the first contact area and the second contact area being electrically connected to the semiconductor component;
    etching a first window between the first contact area and the second contact area such that the at least one insulation layer remains between the first contact area and the second contact area, the first window being etched in a first mask process;
    etching a second window within the first window such that the second window is smaller than the first window and such that a portion of the remaining insulation layer on the upper surface of the semiconductor component is removed so that the upper surface of the semiconductor component is exposed, the second window being etched in a second mask process; and
    applying a metal directly into the second window such that the metal directly contacts the upper surface of semiconductor component thereby forming a third contact area and thereby forming the metal-semiconductor contact.

2. The method according to claim 1, wherein the metal is platinum or tungsten.

3. The method of claim 1, wherein the semiconductor component is a semiconductor material that is silicon or n-doped silicon.

4. The method according to claim 1, wherein after the metal has been applied, a heat treatment occurs so that contact areas of chemical compounds or silicides of the metal with the semiconductor material are formed at contact sites of metal and semiconductor material.

5. The method according to claim 4, wherein the chemically unchanged metal is then removed.

6. The method according to claim 5, wherein after the metal has been removed, an electrically conductive barrier material or titanium is applied to the contact areas so that the contact openings are substantially completely filled.

7. The method according to claim 6, wherein a contact material or a contact metal is applied at least in areas above the contact openings and in contact with at least the barrier material.

8. The method according to claim 7, wherein a passivation layer is then applied to all exposed surfaces of the semiconductor component.

9. The method according to claim 1, wherein the method is a procedure module for manufacturing semiconductor components.

10. The method according to claim 1, wherein the semiconductor component is produced in a standard CMOS process.

11. The method according to claim 1, wherein the semiconductor component is a light-sensitive metal-semiconductor contact.

12. The method according to claim 1, wherein the semiconductor component is a transistor that is produced in a CMOS process.

13. The method according to claim 1, wherein the semiconductor component includes a field oxide layer, the field oxide layer extending within the semiconductor material of the semiconductor component to the upper surface of the semiconductor component.

14. The method according to claim 1, wherein the second mask process is formed in a process step after the first mask process.

* * * * *